US012642052B2

(12) United States Patent
    Tamakawa

(10) Patent No.:  US 12,642,052 B2
(45) Date of Patent:      May 26, 2026

(54) ETCHING CONTROL METHOD AND ETCHING CONTROL SYSTEM

(71) Applicant: Tokyo Electron Limited, Tokyo (JP)

(72) Inventor: Yusuke Tamakawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 609 days.

(21) Appl. No.: 18/099,974

(22) Filed: Jan. 23, 2023

(65) Prior Publication Data

US 2023/0245916 A1      Aug. 3, 2023

(30) Foreign Application Priority Data

Jan. 31, 2022    (JP) ................................. 2022-013324

(51) Int. Cl.
    *H01L 21/3065*        (2006.01)
    *H01L 21/683*         (2006.01)
    *H01L 21/687*         (2006.01)
(52) U.S. Cl.
    CPC .... *H01L 21/68735* (2013.01); *H01L 21/3065* (2013.01); *H01L 21/6838* (2013.01); *H01L 21/6833* (2013.01)
(58) Field of Classification Search
    CPC ............. H01L 21/3065; H01L 21/6838; H01L 21/68735
    See application file for complete search history.

(56) References Cited

U.S. PATENT DOCUMENTS

| | | | | |
|---|---|---|---|---|
| 2010/0022091 | A1* | 1/2010 | Li ..................... | H01J 37/32449 |
| | | | | 156/345.26 |
| 2015/0168130 | A1* | 6/2015 | Matsudo ............ | G01B 9/02021 |
| | | | | 374/161 |
| 2015/0360341 | A1* | 12/2015 | Seyanagi ................ | B24B 37/24 |
| | | | | 438/692 |

FOREIGN PATENT DOCUMENTS

| | | |
|---|---|---|
| JP | 2017-050535 A | 3/2017 |
| JP | 2019-186400 A | 10/2019 |
| JP | 2020-009839 A | 1/2020 |
| JP | 2021-177513 A | 11/2021 |
| WO | 2021/061541 A1 | 4/2021 |

* cited by examiner

*Primary Examiner* — Mark A Connolly
(74) *Attorney, Agent, or Firm* — XSENSUS LLP

(57) ABSTRACT

An etching control method includes (a) collecting shape data including height information of a ring assembly measured at a plurality of locations on a surface of the ring assembly, the ring assembly being disposed to surround an area on a stage on which a substrate is placed; (b) specifying a control amount from the shape data collected in (a) by using a relationship model representing a relationship between pre-collected shape data that has been collected in advance and a control amount capable of controlling a sheath distribution near the ring assembly by which a tilting angle of a recess formed in the substrate by plasma etching is within an allowable range; and (c) applying the control amount specified in (b) thereby controlling the sheath distribution near the ring assembly.

17 Claims, 11 Drawing Sheets

| SHAPE DATA | CONTROL AMOUNT |
|---|---|
| $d_{11}, d_{12}, \cdots d_{1n}$ | $C_1$ |
| $d_{21}, d_{22}, \cdots d_{2n}$ | $C_2$ |
| $\vdots$ | $\vdots$ |
| $d_{m1}, d_{m2}, \cdots d_{mn}$ | $C_m$ |

61

| RECIPE | RELATIONSHIP MODEL |
|--------|--------------------|
| R1 | M1 |
| R2 | M2 |
| ⋮ | ⋮ |

*FIG. 13*

$$C = a_1 d_1 + a_2 d_2 + \cdots + a_n d_n \quad \cdots (1)$$

ETCHING CONTROL METHOD AND ETCHING CONTROL SYSTEM

CROSS-REFERENCE TO RELATED APPLICATION

This application is based on and claims priority from Japanese Patent Application No. 2022-013324 filed on Jan. 31, 2022 with the Japan Patent Office, the disclosure of which is incorporated herein in its entirety by reference.

TECHNICAL FIELD

The present disclosure relates to an etching control method and an etching control system.

BACKGROUND

In an etching device using plasma, a ring assembly is provided around a stage on which a substrate to be processed is placed in order to improve the uniformity of plasma distribution near the outer periphery of the substrate. However, in the process of etching using plasma, the ring assembly is gradually worn away together with the substrate. When the ring assembly is worn away, the uniformity of the plasma distribution near the outer periphery of the substrate decreases, and a so-called tilting in which the recesses formed in the substrate by etching are tilted occurs near the outer periphery of the substrate. The occurrence of tilting may deteriorate the quality of a semiconductor chip and become a factor in lowering the productivity.

Therefore, Japanese Patent Laid-Open Publication No. 2020-009839 discloses a technology in which the degree of wear of the ring assembly is estimated, and when the degree of wear of the ring assembly exceeds a predetermined level, the DC voltage supplied to the ring assembly is changed and the ring assembly is lifted upward.

SUMMARY

According to an aspect of the present disclosure, an etching control method includes (a) collecting shape data including height information of a ring assembly measured at a plurality of locations on a surface of the ring assembly, the ring assembly being disposed to surround an area on a stage on which a substrate is placed; (b) specifying a control amount from the shape data collected in (a) by using a relationship model representing a relationship between pre-collected shape data that has been collected in advance and a control amount capable of controlling a sheath distribution near the ring assembly by which a tilting angle of a recess formed in the substrate by plasma etching is within an allowable range; and (c) applying the control amount specified in (b) thereby controlling the sheath distribution near the ring assembly.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 13 is an equation representing a multiple regression model.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of an etching control method and an etching control system disclosed herein will be described in detail with reference to the accompanying drawings. The present embodiments do not limit the disclosed etching control method and etching control system.

The degree of wear of the ring assembly may be grasped by measuring a distance from a reference position, such as a transfer arm, to a point on the surface of the ring assembly and comparing the measured distance to the distance measured on the unworn ring assembly. However, there is a case where the degree of wear of the entire ring assembly may not be accurately grasped only by measuring the degree of wear at a point on the surface of the ring assembly, and the degree of wear of the ring assembly may be overestimated. When the degree of wear of the ring assembly is overestimated, the frequency of replacement of the ring assembly increases and the running cost of the process increases.

Therefore, the present disclosure provides a technology capable of reducing the frequency of replacement of the ring assembly and reducing the running cost of the process by measuring the degree of wear of the ring assembly more accurately.

First Embodiment

[Configuration of Substrate Processing System 1]

Figure 1:
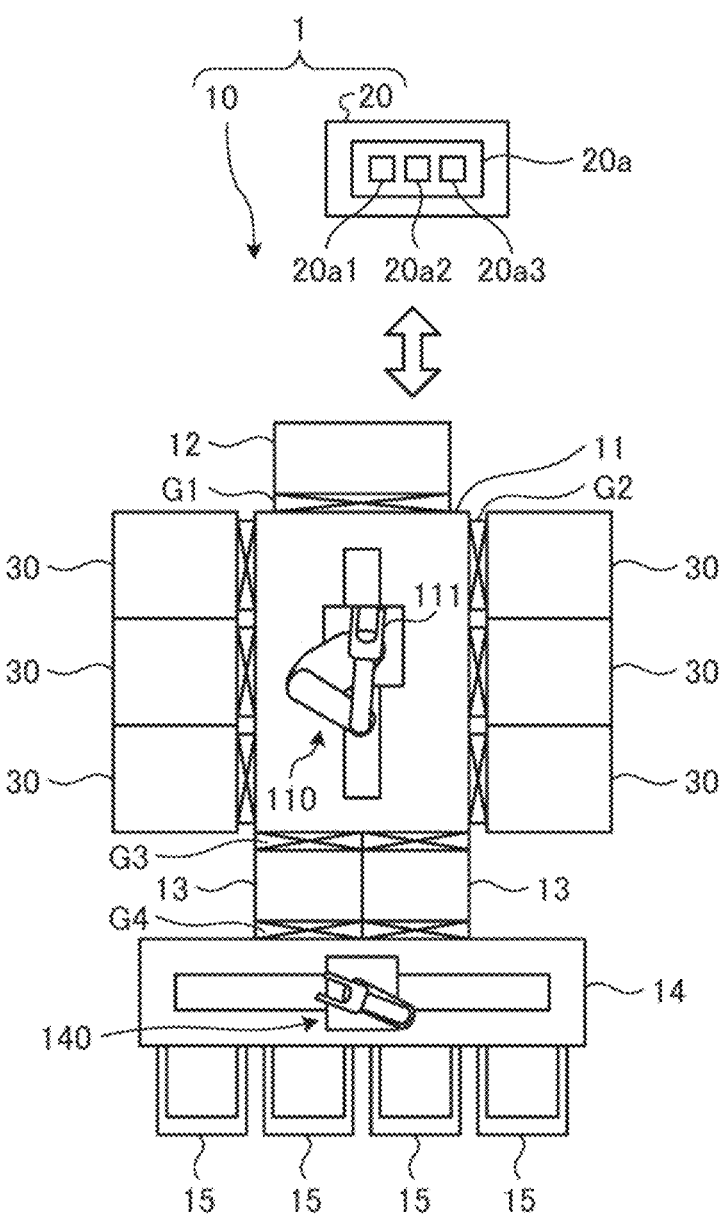
FIG. 1 is a view illustrating an example of the configuration of a substrate processing system.

FIG. 1 is a system configuration diagram illustrating an example of the configuration of a substrate processing system 1. In FIG. 1, for the sake of convenience, certain internal components of a device are illustrated transparently. The substrate processing system 1 includes a device main body 10 and a control device 20 that controls the device main body 10.

The device main body 10 includes a vacuum transfer module 11, a film thickness measurement module 12, a plurality of load lock modules 13, an atmospheric transfer module 14, and a plurality of processing modules 30. The film thickness measurement module 12 is connected to the side wall of the vacuum transfer module 11 via a gate valve G1, and a plurality of processing modules 30 is connected via a gate valves G2.

The film thickness measurement module 12 measures the film thickness of a substrate W. In the present embodiment, the film thickness measurement module 12 measures the thickness of an etching target film formed on the upper surface of the substrate W from an image of the surface of the substrate W captured. As a method for measuring the film thickness of the substrate W, for example, the method disclosed in Japanese Patent Laid-Open Publication No. 2021-148791 may be used. Then, the film thickness measurement module 12 outputs the data of the film thickness distribution of the substrate W to the control device 20.

Each processing module 30 etches the substrate W using plasma. Although six processing modules 30 are connected to the vacuum transfer module 11 in the example of FIG. 1, the number of processing modules 30 connected to the vacuum transfer module 11 may be more than six or less than six.

A plurality of load lock modules 13 is connected to the other side wall of the vacuum transfer module 11 via a gate valve G3. Although two load lock modules 13 are connected to the vacuum transfer module 11 in the example of FIG. 1, the number of load lock modules 13 connected to the vacuum transfer module 11 may be more than two or less than two.

A transfer robot 110 having a transfer arm 111 is disposed in the vacuum transfer module 11. The transfer robot 110 transfers the substrate W among the film thickness measurement module 12, the load lock module 13, and the processing module 30 by the transfer arm 111. The inside of the vacuum transfer module 11 is kept in a pressure atmosphere lower than the atmospheric pressure.

A side wall of each load lock module 13 is connected to the vacuum transfer module 11 via the gate valve G3, and another side wall thereof is connected to the atmospheric transfer module 14 via a gate valve G4. When the substrate W is loaded into the load lock module 13 from the atmosphere transfer module 14 via the gate valve G4, the gate valve G4 is closed and the pressure inside the load lock module 13 is lowered from the atmospheric pressure to a predetermined pressure. Then, the gate valve G3 is opened, and the substrate W in the load lock module 13 is unloaded into the vacuum transfer module 11 by the transfer robot 110.

In a state where the pressure inside the load lock module 13 is lower than the atmospheric pressure, the substrate W is loaded from the vacuum transfer module 11 into the load lock module 13 via the gate valve G3 by the transfer robot 110, and the gate valve G3 is closed. Then, the pressure inside the load lock module 13 is raised to atmospheric pressure. The gate valve G4 is then opened, and the substrate W in the load lock module 13 is unloaded into the atmospheric transfer module 14.

A plurality of load ports 15 is provided on the side wall of the atmospheric transfer module 14 that is different from the side wall of the atmospheric transfer module 14 provided with the gate valve G4. A container, such as a front opening unified pod (FOUP), capable of accommodating a plurality of substrates W is connected to each load port 15. The atmospheric transfer module 14 may be provided with an aligner module for changing the orientation of the substrate W. The pressure in the atmospheric transfer module 14 is atmospheric pressure.

A transfer robot 140 is provided in the atmospheric transfer module 14. The transfer robot 140 transfers the substrate W between the load lock module 13 and the container connected to the load port 15. A fan filter unit (FFU) is provided in the upper portion of the atmospheric transfer module 14, and air from which particles have been removed is supplied into the atmospheric transfer module 14 from above, thereby forming a down flow in the atmospheric transfer module 14. In the present embodiment, the inside of the atmospheric transfer module 14 is under atmospheric pressure, but as another form, the pressure inside the atmospheric transfer module 14 may be controlled to be a positive pressure. As a result, it is possible to suppress particles from entering the atmospheric transfer module 14 from the outside.

The control device 20 processes computer-executable instructions that cause the device main body 10, including the processing module 30, to perform the various steps described in the present disclosure. The control device 20 may be configured to control each element of the device main body 10 to perform the various steps described herein. In an embodiment, a part or entirety of the control device 20 may be included in the device main body 10. The control device 20 may include a processing unit 20a1, a storage unit 20a2, and a communication interface 20a3. The control device 20 is implemented by, for example, a computer 20a. The processing unit 20a1 may be configured to perform various control operations by reading a program from the storage unit 20a2 and executing the read program. The program may be stored in the storage unit 20a2 in advance or may be acquired via a medium when necessary. The acquired program is stored in the storage unit 20a2, read out from the storage unit 20a2 and executed by the processing unit 20a1. The medium may be various storage media readable by the computer 20a, or a communication line connected to the communication interface 20a3. In addition to the program, the storage unit 20a2 also stores recipes and data that are referred to when the recipes are executed. The processing unit 20a1 may be a central processing unit (CPU). The storage unit 20a2 may include a random access memory (RAM), a read only memory (ROM), a hard disk drive (HDD), a solid state drive (SSD), or a combination thereof. The communication interface 20a3 may communicate with the device main body 10 via a communication line such as a local area network (LAN).

[Configuration of Processing Module 30]

Figure 2:
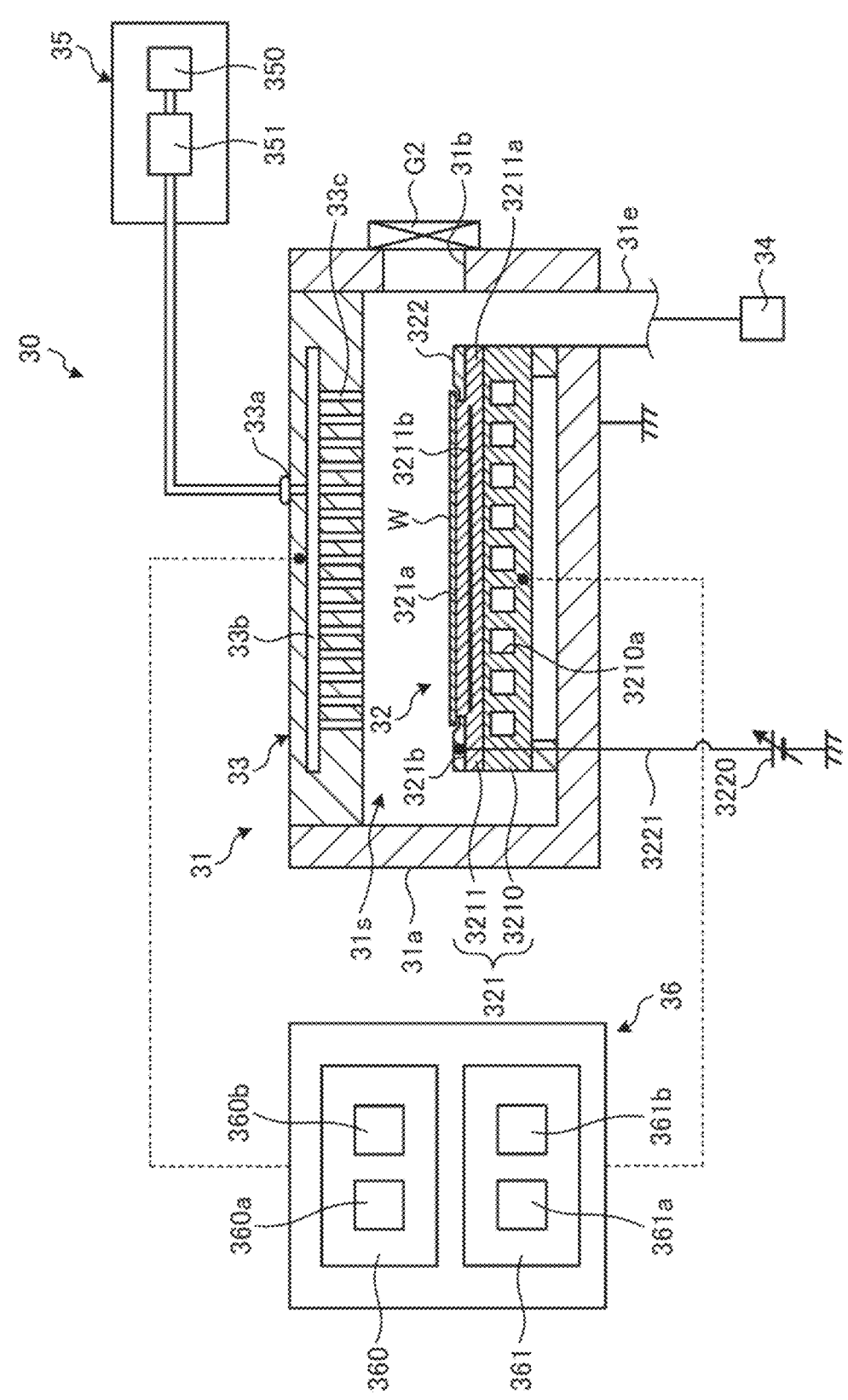
FIG. 2 is a schematic cross-sectional view illustrating an example of a processing module.

FIG. 2 is a schematic cross-sectional view illustrating an example of a processing module 30. In the present embodiment, the processing module 30 is a capacitively coupled plasma etching device. The processing module 30 includes a plasma processing chamber 31, an exhaust system 34, a gas supply unit 35, and a power supply 36. Further, the processing module 30 includes a substrate support portion 32 and a gas introduction portion. The gas introduction portion is configured to introduce at least one processing gas into the plasma processing chamber 31. The gas introduction portion includes a shower head 33. The substrate support portion 32 is disposed in the plasma processing chamber 31. The shower head 33 is disposed above the substrate support portion 32. In the embodiment, the shower head 33 constitutes at least a part of the ceiling of the plasma processing chamber 31. The plasma processing chamber 31 includes a plasma processing space 31s defined by the shower head 33, a side wall 31a of the plasma processing chamber 31, and the substrate support portion 32.

The plasma processing chamber 31 includes at least one gas supply port for supplying at least one processing gas into the plasma processing space 31s and at least one gas exhaust port for exhausting gas from the plasma processing space 31s. The plasma processing chamber 31 is grounded. The shower head 33 and the substrate support portion 32 are electrically insulated from the housing of the plasma processing chamber 31. The side wall 31a of the plasma processing chamber 31 is formed with an opening 31b for loading the substrate W into the plasma processing chamber 31 and for unloading the substrate W from the plasma processing chamber 31. The opening 31b is opened and closed by the gate valve G2.

The substrate support portion 32 includes a main body 321 and a ring assembly 322. The substrate support portion 32 is an example of a stage. The main body 321 has a central region 321a for supporting the substrate (wafer) W and an annular region 321b for supporting the ring assembly 322. The annular region 321b of the main body 321 surrounds the central region 321a of the main body 321 in a plan view. The substrate W is disposed on the central region 321a of the main body 321, and the ring assembly 322 is disposed on the annular region 321b of the main body 321 to surround the substrate W on the central region 321a of the main body 321. Therefore, the central region 321a is also referred to as a substrate support surface for supporting the substrate W, and the annular region 321b is also referred to as a ring support surface for supporting the ring assembly 322.

In the present embodiment, a variable DC voltage source 3220 is connected to the ring assembly 322 via a wiring 3221. By controlling the magnitude of the DC voltage applied to the ring assembly 322 by the variable DC voltage source 3220, the sheath distribution of the plasma formed near ring assembly 322 may be controlled. The variable DC voltage source 3220 is an example of a sheath controller, and the magnitude of the DC voltage applied to the ring assembly 322 is an example of a control amount capable of controlling the sheath distribution.

In the embodiment, the main body 321 includes a base 3210 and an electrostatic chuck 3211. The base 3210 includes a conductive member. The conductive member of the base 3210 may function as a lower electrode. The electrostatic chuck 3211 is disposed on the base 3210. The electrostatic chuck 3211 includes a ceramic member 3211a and an electrostatic electrode 3211b disposed within the ceramic member 3211a. The ceramic member 3211a has the central region 321a. In the embodiment, the ceramic member 3211a also has an annular region 321b. Other members surrounding the electrostatic chuck 3211, such as an annular electrostatic chuck or an annular insulating member, may have the annular region 321b. In this case, the ring assembly 322 may be disposed on the annular electrostatic chuck or the annular insulating member or may be disposed on both the electrostatic chuck 3211 and the annular insulating member. Further, at least one RF/DC electrode coupled to a radio-frequency (RF) power supply 360 and/or a direct current (DC) power supply 361 (to be described later) may be disposed in the ceramic member 3211a. In this case, at least one RF/DC electrode functions as the lower electrode. When a bias RF signal and/or DC signal (to be described below) is connected to at least one RF/DC electrode, the RF/DC electrode is also referred to as a bias electrode. The conductive member of the base 3210 and at least one RF/DC electrode may function as multiple lower electrodes. Further, the electrostatic electrode 3211b may function as a lower electrode. Therefore, the substrate support portion 32 includes at least one lower electrode.

The ring assembly 322 includes one or more annular members. In the embodiment, one or more annular members include one or more edge rings and at least one cover ring. The edge ring is disposed around the central region 321a of the substrate support portion 32 for supporting the substrate W, and the cover ring is disposed around the edge ring. The edge ring is made of a conductive material or an insulating material, and the cover ring is made of an insulating material.

Further, the substrate support portion 32 may include a temperature control module configured to adjust at least one of the electrostatic chuck 3211, the ring assembly 322, and the substrate W to a target temperature. The temperature control module may include a heater, a heat transfer medium, a flow path 3210a, or a combination thereof. A heat transfer fluid, such as brine or gas, flows through the flow path 3210a. In the embodiment, the flow paths 3210a are formed in the base 3210 and one or more heaters are positioned in the ceramic member 3211a of the electrostatic chuck 3211. Further, the substrate support portion 32 may include a heat transfer gas supply unit configured to supply a heat transfer gas between the back surface of the substrate W and the central region 321a.

The shower head 33 is configured to introduce at least one processing gas from the gas supply unit 35 into the plasma processing space 31s. The shower head 33 includes at least one gas supply port 33a, at least one gas diffusion chamber 33b, and a plurality of gas introduction ports 33c. The processing gas supplied to the gas supply port 33a passes through the gas diffusion chamber 33b and is introduced from the plurality of gas introduction ports 33c into the plasma processing space 31s. The shower head 33 also includes at least one upper electrode. In addition to the shower head 33, the gas introduction portion may include one or more side gas injectors (SGI) attached to one or more openings formed in the side wall 10a.

The gas supply unit 35 may include at least one gas source 350 and at least one flow rate controller 351. In the embodiment, the gas supply unit 35 is configured to supply at least one processing gas from the corresponding gas source 350 to the shower head 33 via the corresponding flow rate controller 351. Each flow rate controller 351 may include, for example, a mass flow controller or a pressure-controlled flow rate controller. Further, the gas supply unit 35 may include one or more flow rate modulation devices that modulate or pulse the flow rate of at least one processing gas.

The power supply 36 includes a RF power supply 360 coupled to the plasma processing chamber 31 via at least one impedance matching circuit. The RF power supply 360 is configured to supply at least one RF signal (RF power) to at least one lower electrode and/or at least one upper electrode. As a result, plasma is generated from at least one processing gas supplied to the plasma processing space 31s. Therefore, the RF power supply 360 may function as at least a part of a plasma generation unit configured to generate plasma from one or more processing gases in the plasma processing chamber 31. Further, by supplying the bias RF signal to at least one lower electrode, a bias potential is generated in the substrate W, and the ionic components in the formed plasma may be drawn into the substrate W.

In the embodiment, the RF power supply includes a first RF generation unit 360a and a second RF generation unit 360b. The first RF generation unit 360a is configured to be coupled to at least one lower electrode and/or at least one upper electrode via at least one impedance matching circuit, and generate a source RF signal (source RF power) for plasma generation. In the embodiment, the source RF signal has frequencies in the range of 10 MHz to 150 MHz. In the embodiment, the first RF generation unit 360a may be configured to generate a plurality of source RF signals having different frequencies. One or more source RF signals generated are supplied to at least one lower electrode and/or at least one upper electrode.

The second RF generation unit 360b is configured to be coupled to at least one lower electrode via at least one impedance matching circuit, and generate a bias RF signal (bias RF power). The frequency of the bias RF signal may be the same as or different from the frequency of the source RF signal. In the embodiment, the frequency of the bias RF signal is a frequency lower than the frequency of the source RF signal. In the embodiment, the frequency of the bias RF signal has frequencies in the range of 100 kHz to 60 MHz. In the embodiment, the second RF generation unit 360a may be configured to generate a plurality of source RF signals having different frequencies. One or more bias RF signals generated are supplied to at least one lower electrode. In various embodiments, at least one of the source RF signal and the bias RF signal may be pulsed.

Further, the power supply 36 may include a DC power supply 361 coupled to the plasma processing chamber 31. The RF power supply includes a first DC generation unit 361a and a second DC generation unit 361b. In the embodiment, the first DC generation unit 361a is configured to be connected to at least one lower electrode and generate a first DC signal. The generated first bias DC signal is applied to at least one lower electrode. In the embodiment, the second DC generation unit 361b is configured to be connected to at least one upper electrode and generate a second DC signal. The generated second bias DC signal is applied to at least one upper electrode.

In various embodiments, at least one of the first and second DC signals may be pulsed. In this case, sequences of voltage pulses are applied to at least one lower electrode and/or at least one upper electrode. The voltage pulses may have a pulse waveform in a rectangular shape, a trapezoidal shape, a triangular shape, or a combination thereof. In the embodiment, a waveform generation unit for generating sequences of voltage pulses from the DC signal is connected between the first DC generation unit 361a and at least one lower electrode. Therefore, the first DC generation unit 361a and the waveform generation unit constitute a voltage pulse generation unit. When the second DC generation unit 361b and the waveform generation unit constitute a voltage pulse generation unit, the voltage pulse generation unit is connected to at least one upper electrode. The voltage pulse may have a positive polarity or a negative polarity. Further, the sequence of voltage pulses may include one or more positive voltage pulses and one or more negative voltage pulses in one cycle. The first and second DC generation units 361a and 361b may be provided in addition to the RF power supply 360, and the first DC generation unit 361a may be provided in place of the second RF generation unit 360b.

The exhaust system 34 may be connected to, for example, a gas exhaust port 31e provided at the bottom of the plasma processing chamber 31. The exhaust system 34 may include a pressure regulating valve and a vacuum pump. The pressure regulating valve adjusts the pressure in the plasma processing space 31s. The vacuum pump may include a turbo molecular pump, a dry pump, or a combination thereof

[Change in Incident Direction of Charged Particles]

Figure 3A:
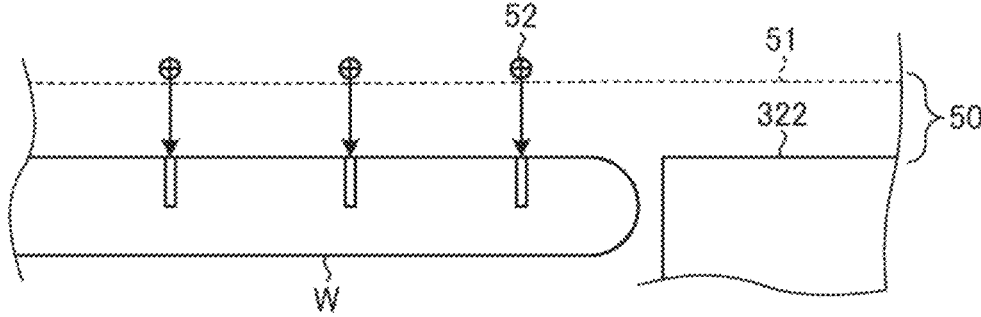
FIG. 3A is a view illustrating a relationship between tilting and sheath distribution.

Descriptions will be made on a relationship between the state of sheath distribution of the plasma generated in the plasma processing space 31s and recesses such as holes and trenches formed in the substrate W. When the height of a boundary 51 of a sheath region 50 above the ring assembly 322 and the height of the boundary 51 of the sheath region 50 above the substrate W are approximately the same, the distribution of the boundary 51 of the sheath region 50 is, for example, as illustrated in FIG. 3A. In this case, the incident direction of the charged particles 52 such as ions in the plasma is substantially perpendicular to the substrate W even near the edge of the substrate W. As a result, the recess is formed substantially perpendicular to the surface of the substrate W.

Figure 3B:
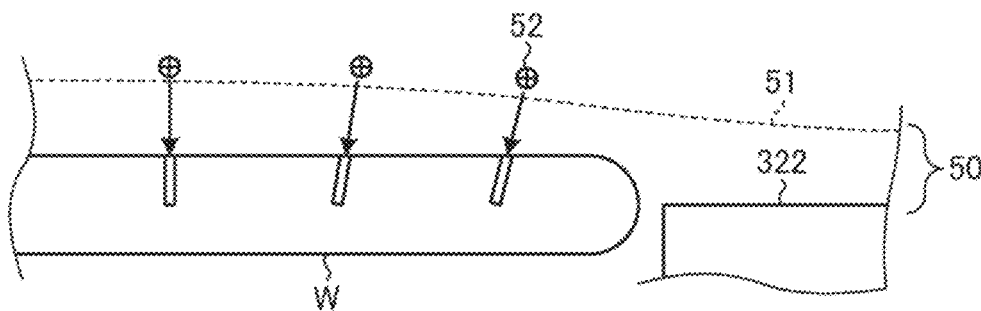
FIG. 3B is a view illustrating a relationship between tilting and sheath distribution.

Meanwhile, when the height of the ring assembly 322 is reduced due to wear of the ring assembly 322, the height of the boundary 51 of the sheath region 50 above the ring assembly 322 is shorter than the height of the boundary 51 of the sheath region 50 above the substrate W. Thus, as illustrated in FIG. 3B, for example, the boundary 51 of the sheath region 50 near the edge of the substrate W is tilted, and the incident direction of the charged particles 52 in the plasma is tilted. As a result, the recess is obliquely formed with respect to the surface of the substrate W, and tilting occurs.

Figure 3C:
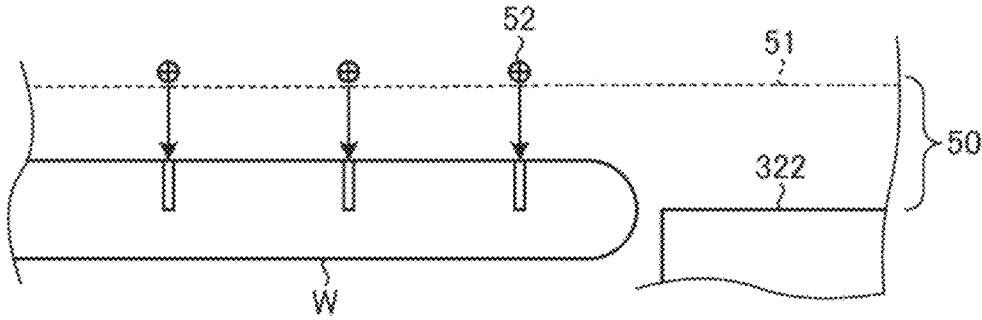
FIG. 3C is a view illustrating a relationship between tilting and sheath distribution.

Therefore, in the present embodiment, a DC voltage is applied from the variable DC voltage source 3220 to the ring assembly 322 when the height of the ring assembly 322 is lowered due to wear of the ring assembly 322. By adjusting the magnitude of the DC voltage applied to the ring assembly 322, the height of the boundary 51 of the sheath region 50 above the ring assembly 322 and the height of the boundary 51 of the sheath region 50 above the substrate W may be aligned, as illustrated in, for example, FIG. 3C. As a result, the incident direction of the charged particles 52 such as ions in the plasma may be returned to the direction substantially perpendicular to the substrate W, and tilting of the recess may be suppressed.

There is a correlation between the etching rate distribution and the degree of inclination of the recess due to tilting. Therefore, by measuring the etching rate distribution, it is possible to estimate the inclination of the recess due to tilting. For example, the etching rate distribution when no tilting occurs (hereinafter, referred to as a "first distribution") and the etching rate distribution when the inclination of the recess reaches the maximum inclination within the allowable range (hereinafter, referred to as a "second distribution") are measured in advance. Then, etching is performed on a plurality of substrates W, and the etching rate distribution for each substrate W is measured.

Figure 4:
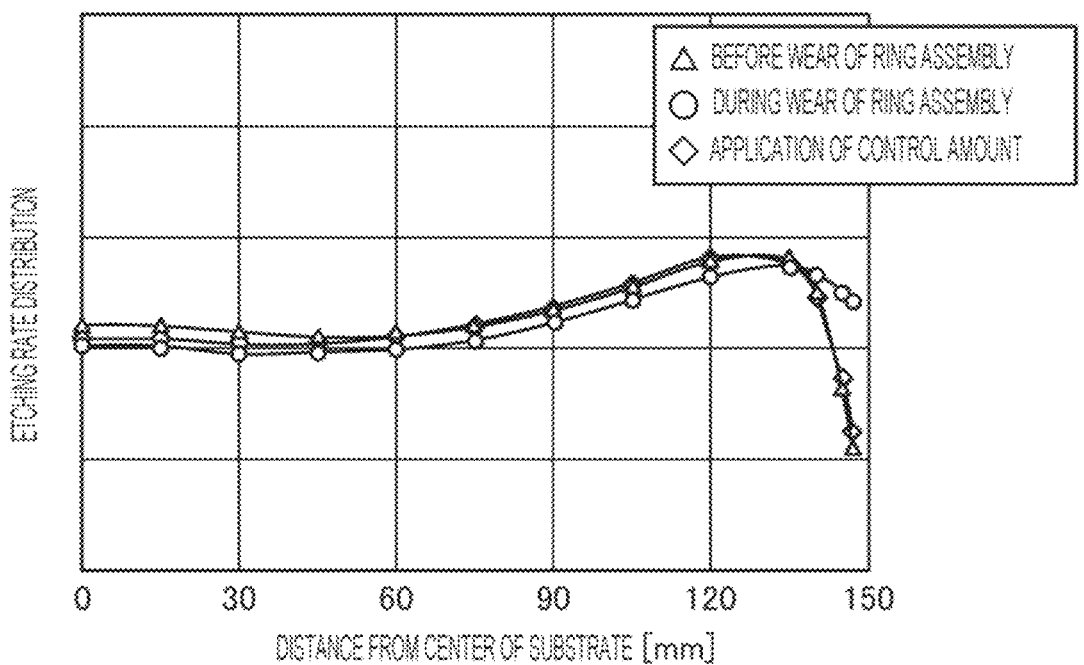
FIG. 4 is a view illustrating an example of an etching rate distribution.

When the ring assembly 322 is not worn out, the measured etching rate distribution becomes a distribution close to the first distribution (see, e.g., "before wear of ring assembly" in FIG. 4). As the number of times of etching increases, the ring assembly 322 is gradually worn out, and the measured etching rate distribution approaches the second distribution, and eventually reaches the second distribution (see, e.g., "during wear of ring assembly" in FIG. 4). At this time, a DC voltage is applied to the ring assembly 322 according to the degree of wear of the ring assembly 322. As a result, the etching rate distribution returns to a distribution close to the first distribution (see, e.g., "application of control amount" in FIG. 4). When the ring assembly 322 is worn within the variable range of the DC voltage such that the etching rate distribution may not be returned to a distribution close to the first distribution, the worn ring assembly 322 is replaced with a ring assembly 322 that has not been worn.

[Measurement of Shape of Ring Assembly 322]

In the present embodiment, a DC voltage is applied to the ring assembly 322 according to the degree of wear of the ring assembly 322. In the present embodiment, the degree of wear of the ring assembly 322 is acquired as shape data measured by a distance sensor 111*a* provided on the transfer arm 111.

Figure 5:
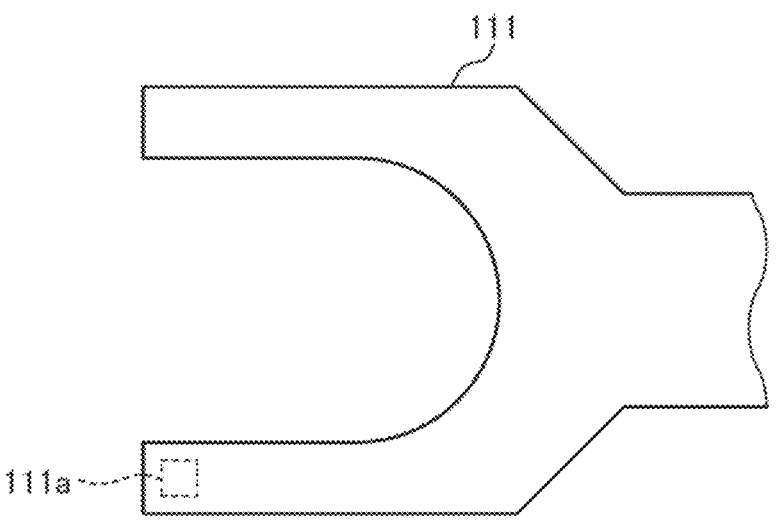
FIG. 5 is a view illustrating an example of an arrangement of a distance sensor.
Figure 6:
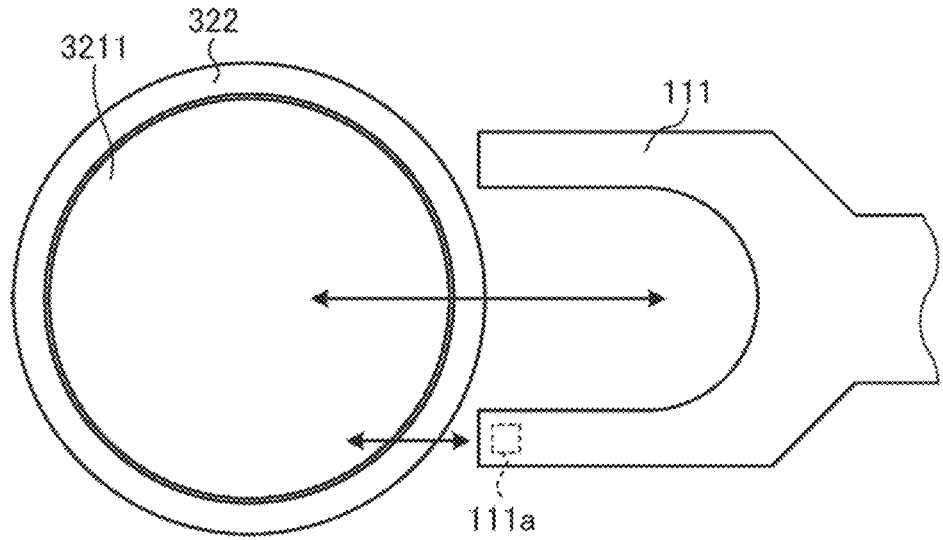
FIG. 6 is a view illustrating an example of a process of collecting shape data of a ring assembly.
Figures 7, 8:
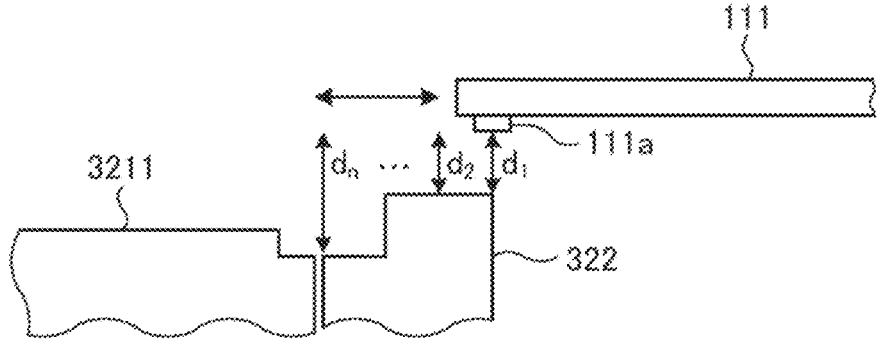
FIG. 7 is a view illustrating an example of a process of collecting shape data of a ring assembly.
FIG. 8 is a view illustrating an example of actual measurement data.

In the present embodiment, the distance sensor 111*a* is provided on the lower surface of the transfer arm 111, as illustrated in, for example, FIGS. 5 and 7. As illustrated in, for example, FIGS. 6 and 7, when the transfer arm 111 passes over the ring assembly 322, the distance sensor 111*a* measures a distance d between the distance sensor 111*a* and the upper surface of the ring assembly 322. In the present embodiment, as illustrated in, for example, FIG. 7, distances $d_1$ to $d_n$ between the distance sensor 111*a* and the ring assembly 322 are measured at a plurality of positions on the surface of the ring assembly 322. The distances $d_1$ to $d_n$ are information indicating the height of the ring assembly 322 based on the height of the distance sensor 111*a*. The distance sensor 111*a* outputs the distances $d_1$ to $d_n$ measured at each position to the control device 20 as shape data.

As described above, in the present embodiment, information indicating the height of the ring assembly 322 is collected at a plurality of locations on the surface of the ring assembly 322. As a result, the cross-sectional shape of the ring assembly 322 may be measured more accurately than when information indicating the height of the ring assembly 322 is collected at one point on the surface of the ring assembly 322. Thus, the degree of wear of the ring assembly 322 may be grasped more accurately.

[Relationship Between Shape of Ring Assembly 322 and Magnitude of DC Voltage Applied to Ring Assembly 322]

In the present embodiment, a relationship between the shape of the ring assembly 322 and the magnitude of the DC voltage applied to the ring assembly 322 is approximated by a relationship model. The relational model in the present embodiment is, for example, a multiple regression model. The multiple regression model is represented, for example, by Equation (1) in FIG. 13.

In Equation (1), C represents a control amount that is the magnitude of the DC voltage applied to the ring assembly 322, $a_1$ to $a_n$ represent the coefficients of the multiple regression model, and $d_1$ to $d_n$ represent the shape data measured by the distance sensor 111*a*.

The coefficients $a_1$ to $a_n$ of the multiple regression model represented by Equation (1) are specified by training using actual measurement data 60 as illustrated in, for example, FIG. 8 as training data. In the actual measurement data 60, the shape data $d_1$ to $d_n$ of the ring assembly 322 is associated with the magnitude of the DC voltage applied to the ring assembly 322 (control amount C). The shape data $d_1$ to $d_n$ in the actual measurement data 60 is obtained by actual measurement by the distance sensor 111*a*. In addition, the control amount C in the actual measurement data 60 is a value that is adjusted by experiments such that the height of the boundary 51 of the sheath region 50 above the ring assembly 322 and the height of the boundary 51 of the sheath region 50 above the substrate W are aligned. The coefficients $a_1$ to $a_n$ of the multiple regression model are specified using a regression algorithm such as an ordinary least squares regression (OLS), Lasso, Ridge, or ElasticNet.

The data of the multiple regression model represented by Equation (1) is created in advance and stored in the storage unit 20*a*2.

In the actual operation, the control device 20 collects the shape data of the ring assembly 322 worn by plasma etching using the distance sensor 111*a*, and the control amount C corresponding to the collected shape data is specified using the multiple regression model illustrated in Equation (1). Then, the control device 20 controls the variable DC voltage source 3220 such that a DC voltage having a magnitude corresponding to the specified control amount C is applied to the ring assembly 322. Thus, the DC voltage of the ring assembly 322 may be adjusted such that the height of the boundary 51 of the sheath region 50 above the ring assembly 322 and the height of the boundary 51 of the sheath region 50 above the substrate W are aligned according to the degree of wear of the ring assembly 322. As a result, tilting of the recess formed in the substrate W may be suppressed.

When the control amount C specified by the relationship model exceeds a range in which the DC voltage may be changed by the variable DC voltage source 3220, the control device 20 determines that the ring assembly 322 needs to be replaced, and notifies the user of the substrate processing system 1 to that effect. When notified that the ring assembly 322 needs to be replaced, the user of the substrate processing system 1 replaces the ring assembly 322.

[Etching Control Method]

Figure 9:
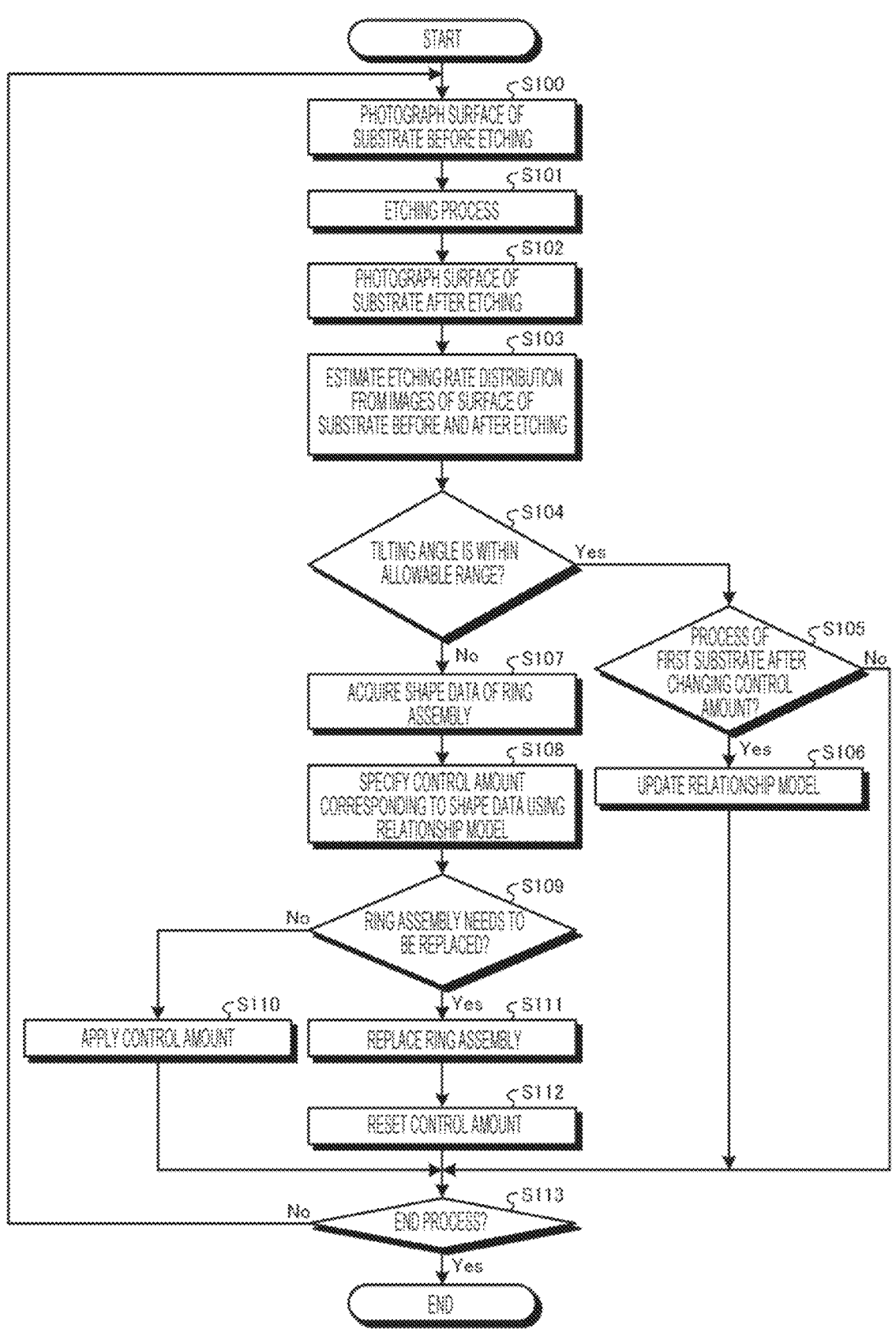
FIG. 9 is a flowchart illustrating an example of an etching control method according to a first embodiment.

FIG. 9 is a flowchart illustrating an example of an etching control method according to a first embodiment. When the processing unit 20*a*1 of the control device 20 reads a program from the storage unit 20*a*2, executes the read program, and controls each unit of the device main body 10 via the communication interface 20*a*3, the process illustrated in FIG. 9 is implemented. FIG. 9 describes the process when one recipe is executed.

First, the transfer robot 140 takes out the substrate W from the container set in the load port 15 and loads the substrate W into the load lock module 13. Then, the gate valve G4 is closed, and the pressure inside the load lock module 13 is controlled to be substantially identical to the pressure inside the vacuum transfer module 11. Then, the gate valve G3 is opened, the substrate W is taken out from the load lock module 13 by the transfer robot 110, and the gate valve G3 is closed. Then, the gate valve G1 is opened, the substrate W is loaded into the film thickness measurement module 12 by the transfer robot 110, and the gate valve G1 is closed. Then, the surface of the substrate W before etching is photographed by the film thickness measurement module 12 (S100).

Next, an etching process is performed on the substrate W (S101). In step S101, the gate valve G1 is opened, the substrate W is unloaded from the film thickness measurement module 12 by the transfer robot 110, and the gate valve G1 is closed. Then, the gate valve G2 is opened, the substrate W is unloaded into the processing module 30 by the transfer robot 110, and the gate valve G2 is closed. Then, etching using plasma is performed on the substrate W by the processing module 30.

Next, the surface of the substrate W after etching is photographed by the film thickness measurement module 12 (S102). In step S102, the gate valve G2 is opened, the substrate W is unloaded from the processing module 30 by the transfer robot 110, and the gate valve G2 is closed. Then, the gate valve G1 is opened, the substrate W is loaded into the film thickness measurement module 12 by the transfer robot 110, and the gate valve G1 is closed. Then, the surface of the substrate W after etching is photographed by the film thickness measurement module 12. Then, the gate valve G1 is opened, the substrate W is unloaded from the film thickness measurement module 12 by the transfer robot 110, and the gate valve G1 is closed. Then, the gate valve G3 is opened, the substrate W is unloaded into the load lock module 13 by the transfer robot 110, and the gate valve G3 is closed. After the pressure in the load lock module 13 is controlled to be substantially identical to the pressure in the atmosphere transfer module 14, the gate valve G4 is opened. Then, the substrate W is unloaded from the load lock module 13 by the transfer robot 140 and stored in a container set in the load port 15.

Next, the etching rate distribution is estimated from the images of the surface of the substrate W before and after etching (S103). In step S103, the film thickness measurement module 12 measures the thickness of an etching target film formed on the upper surface of the substrate W in each of the image of the substrate W before etching and the image of the substrate W after etching. Then, the film thickness measurement module 12 outputs the data of the film thickness distribution before etching and the data of the film thickness distribution after etching to the control device 20. The control device 20 estimates the etching rate distribution from a difference between the film thickness distribution before etching and the film thickness distribution after etching.

Next, the control device 20 determines whether the tilting angle of the recess formed in the substrate W is within the allowable range from the estimated etching rate distribution (S104). Step S104 is an example of step (d). For example, the storage unit 20a2 of the control device 20 stores in advance data of the etching rate distribution when the tilting angle of the recess is within the allowable range, and data of the etching rate distribution when the tilting angle of the recess is outside the allowable range. In step S104, for example, the control device 20 calculates the degree of similarity between the etching rate distribution estimated in step S103 and the etching rate distribution stored in advance in the storage unit 20a2. Then, when the distribution with the highest degree of similarity to the etching rate distribution estimated in step S103 is the distribution when the tilting angle of the recess is outside the allowable range, the control device 20 determines that the tilting angle of the recess is outside the allowable range.

When it is determined that the tilting angle of the recess formed in the substrate W is within the allowable range (S104: "Yes"), the control device 20 determines whether the process of step S101 is the process of a first substrate W after changing the control amount (S105). When it is determined that the process of step S101 is not the process of the first substrate W after changing the control amount (S105: "No"), the control device 20 determines whether to end the process (S113). When the process is determined not to end (S113: "No"), the process illustrated in step S100 is performed again for another substrate W. Meanwhile, when the process is determined to end (S113: "Yes"), the process illustrated in the flowchart ends.

Meanwhile, when the process of step S101 is the process of the first substrate W after changing the control amount (S105: "Yes"), the control device 20 updates the relationship model (S106) and executes the process illustrated in step S113. In step S106, online learning of the relationship model is performed using a combination of the shape data collected in step S107 (to be described later) and the control amount specified in step S108 as teacher data, and the relationship model is updated. In the present embodiment, the coefficients of the multiple regression model represented by Equation (1) are updated by online learning using a combination of the shape data collected in step S107 (to be described later) and the control amount specified in step S108 as teacher data. By updating the relationship model, tilting may be suppressed more accurately using the control amount.

When it is determined that the tilting angle of the recess formed in the substrate W is outside the allowable range (S104: "No"), the control device 20 acquires the shape data of the ring assembly 322 (S107). In step S107, the control device 20 controls the transfer robot 110 and the distance sensor 111a to acquire shape data including the distances $d_1$ to $d_n$ measured by the distance sensor 111a. Step S107 is an example of step (a). Cleaning within the processing module 30 may be performed before step S107 is performed. As a result, reaction by-products (so-called deposits) adhering to the ring assembly 322 are removed, and the shape of the ring assembly 322 may be measured with higher accuracy.

Next, the control device 20 uses the relationship model to specify the control amount corresponding to the acquired shape data (S108). Step S108 is an example of step (b). Then, the control device 20 determines whether the control amount specified by the relationship model exceeds the range in which the DC voltage may be changed by the variable DC voltage source 3220, thereby determining whether the ring assembly 322 needs to be replaced (S109). When it is determined that the specified control amount is within a range in which the DC voltage may be changed by the variable DC voltage source 3220, that is, when the ring assembly 322 does not need to be replaced (S109: "No"), the control device 20 applies the specified control amount to the variable DC voltage source 3220. This controls the sheath distribution near the ring assembly 322 (S110). Step S110 is an example of step (c). As a result, tilting of the boundary 51 of the sheath region 50 near the edge of the substrate W is suppressed, and tilting of the recess formed in the substrate W by etching is suppressed. Then, the control device 20 executes the process illustrated in step S113.

Meanwhile, when it is determined that the specified control amount exceeds the range in which the DC voltage may be changed by the variable DC voltage source 3220, that is, when the ring assembly 322 needs to be replaced (S109: "Yes"), the ring assembly 322 is replaced (S111). In step S111, the control device 20 notifies the user of the substrate processing system 1 that the ring assembly 322 needs to be replaced, and the user of the substrate processing system 1 replaces the ring assembly 322. After the ring assembly 322 is replaced, the control device 20 resets the control amount applied to the variable DC voltage source 3220 to 0 (S112), and executes the process illustrated in step S113.

The first embodiment has been described above. As described above, an etching control method according to the present embodiment includes steps (a), (b), and (c). In step (a), shape data including height information of a ring assembly 322 measured at a plurality of locations on a surface of the ring assembly 322 disposed to surround an area on a substrate support portion 32 on which a substrate W is placed, is collected. In step (b), the control amount from the shape data collected in step (a) is specified using a relationship model representing a relationship between pre-collected shape data and a control amount capable of controlling a sheath distribution near the ring assembly 322 by which a tilting angle of a recess formed in the substrate W by plasma etching is within an allowable range. In step (c), the specified control amount is applied, thereby controlling the sheath distribution near the ring assembly 322. As a result, the frequency of replacement of the ring assembly 322 including the edge ring and the cover ring may be reduced, and the running cost of the process may be reduced.

In the above-described embodiment, in step (a), a distance sensor 111*a* provided on a transfer arm 111 that transfers the substrate W is used to measure a distance between the distance sensor 111*a* and the ring assembly 322 at a plurality of positions on the surface of the ring assembly 322, and the distance measured at each position is included in the shape data as height information of the ring assembly 322 at each position. Thus, the degree of wear of the ring assembly 322 may be grasped more accurately.

Further, the etching control method in the above-described embodiment further includes step (d). In step (d), the etching rate distribution is estimated based on a difference between the film thickness distribution of the substrate W before the plasma etching is performed and the film thickness distribution of the substrate W after the plasma etching is performed, and from the etching rate distribution, it is determined whether the tilting angle of the recess is within the allowable range. As a result, the process of driving the transfer arm 111 and collecting the shape data of the ring assembly 322 by the distance sensor 111*a* may be omitted, and the running cost of the process may be reduced.

The etching control method in the above-described embodiment further includes step (e). In step (e), after the shape data is collected by step (a), the control amount is specified by step (b), and the sheath distribution near the ring assembly 322 is controlled by step (c), when the tilting angle is determined to be within the allowable range in (d), the relationship model is updated using the shape data and the control amount. As a result, the relationship model is updated according to the characteristics of the processing module 30 that has performed plasma etching on the substrate W, and tilting may be suppressed more accurately.

Further, the etching control system in the above-described embodiment includes a processing module 30 that etches the substrate W using plasma, a vacuum transfer module 11 that transfers the substrate W to the processing module 30, and a control device 20. The processing module 30 includes a plasma processing chamber 31, a substrate support portion 32 that is provided in the plasma processing chamber 31 and on which the substrate W is placed, a ring assembly 322 disposed to surround an area on the substrate support portion 32 on which the substrate W is placed, and a variable DC voltage source 3220 that controls the sheath distribution near the ring assembly 322. The vacuum transfer module 11 includes a transfer robot 110 having a transfer arm 111 that transfers the substrate W, and a distance sensor 111*a* provided on the transfer arm 111. The control device 20 executes steps (a), (b), and (c). In step (a), the transfer arm 111 and the distance sensor 111*a* are controlled to collect shape data including height information of the ring assembly 322 measured at a plurality of positions on the surface of the ring assembly 322. In step (b), the control amount from the shape data collected in step (a) is specified using a relationship model representing a relation between the pre-collected shape data and the control amount of the variable DC voltage source 3220 by which the tilting angle of the recess formed in the substrate W by plasma etching is within the allowable range. In step (c), the specified control amount is applied to the variable DC voltage source 3220, thereby controlling the sheath distribution near the ring assembly 322. As a result, the frequency of replacement of the ring assembly 322 including the edge ring and the cover ring may be reduced, and the running cost of the process may be reduced.

Second Embodiment

Although one recipe is executed in one processing module 30 in the first embodiment described above, a plurality of different recipes may be executed in one processing module 30 in a second embodiment. Different recipes may have different processing conditions, such as the frequency and magnitude of RF power and the pressure in the plasma processing chamber 31. When the processing conditions are different, the state of the sheath near the ring assembly 322 may be different during plasma etching. Thus, it is not necessarily appropriate that the control amount applied to the ring assembly 322 in the recipe before change is also applied to the ring assembly 322 in the recipe after change. Therefore, different recipes lead to different relationship models.

Figure 10:
FIG. 10 is a view illustrating an example of a model table.

Therefore, in the present embodiment, a relationship model is prepared in advance for each recipe, as illustrated in, for example, FIG. 10. FIG. 10 is a view illustrating an example of a model table 61. The model table 61 is created in advance and stored in the storage unit 20*a*2 before operation. Then, when the recipe is changed, the shape data of the ring assembly 322 is collected, and the control amount corresponding to the collected shape data is specified again using the relationship model corresponding to the changed recipe.

[Etching Control Method]

Figure 11:
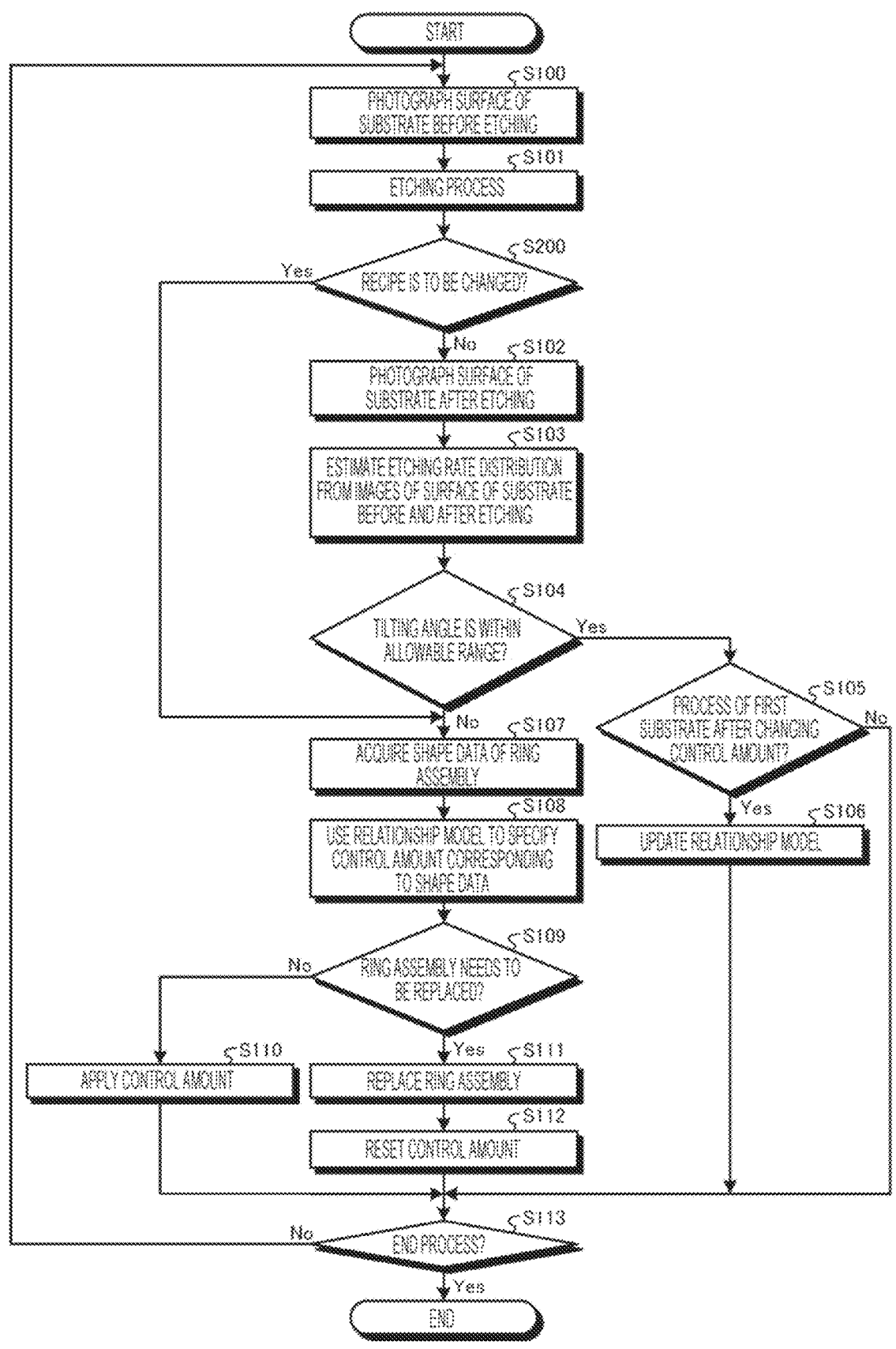
FIG. 11 is a flowchart illustrating an example of an etching control method according to a second embodiment.

FIG. 11 is a flowchart illustrating an example of the etching control method according to the second embodiment. Except for the points described below, the processes in FIG. 11 denoted by the same reference numerals as those in FIG. 9 are the same as the processes described in FIG. 9, and thus, descriptions thereof are omitted.

After etching the substrate W in step S101, the gate valve G2 is opened in step S200, the substrate W is unloaded from the processing module 30 by the transfer robot 110, and the gate valve G2 is closed. Then, the control device 20 determines whether to change the recipe according to an instruction from the user of the substrate processing system 1 (S200). When it is determined that the recipe is not changed (S200: "No"), the process illustrated in step S102 is executed.

Meanwhile, when it is determined that the recipe is to be changed (S200: "Yes"), the substrate W, which has been etched according to the recipe before change, is accommodated in a container set in the load port 15 via the load lock module 13 and atmospheric transfer module 14. The control device 20 acquires again the shape data of the ring assembly 322 (S107). Next, the control device 20 specifies the control amount corresponding to the acquired shape data using the relationship model corresponding to the changed recipe (S108).

The second embodiment has been described above. As described above, the relationship model in the present embodiment is prepared in advance for each recipe. In step (b), when the recipe is changed, the control amount is specified from the shape data collected in step (a) using the relationship model corresponding to the recipe after the change. Thus, even when the recipe is changed, tilting may be suppressed in the etching process according to the changed recipe.

Third Embodiment

In the first embodiment described above, when the control amount specified by the relationship model exceeds the range in which the DC voltage may be changed by the variable DC voltage source 3220 in the execution of one recipe, the ring assembly 322 is replaced. In the present embodiment, when the control amount specified by the relationship model corresponding to the recipe being executed exceeds the changeable control amount range, it is determined whether the control amount specified by the relationship model of the other recipe is within the changeable control amount range. Then, when the control amount specified by the relationship model of the other recipe is a value within the changeable control amount range, the other recipe is executed without replacing the ring assembly 322. As a result, the frequency of replacement of the ring assembly 322 may be reduced, and the running cost of the process may be reduced. Also, in the present embodiment, as in the second embodiment, a model table 61 (see, e.g., FIG. 10) is created in advance before operation and stored in the storage unit 20a2.

[Etching Control Method]

Figure 12:
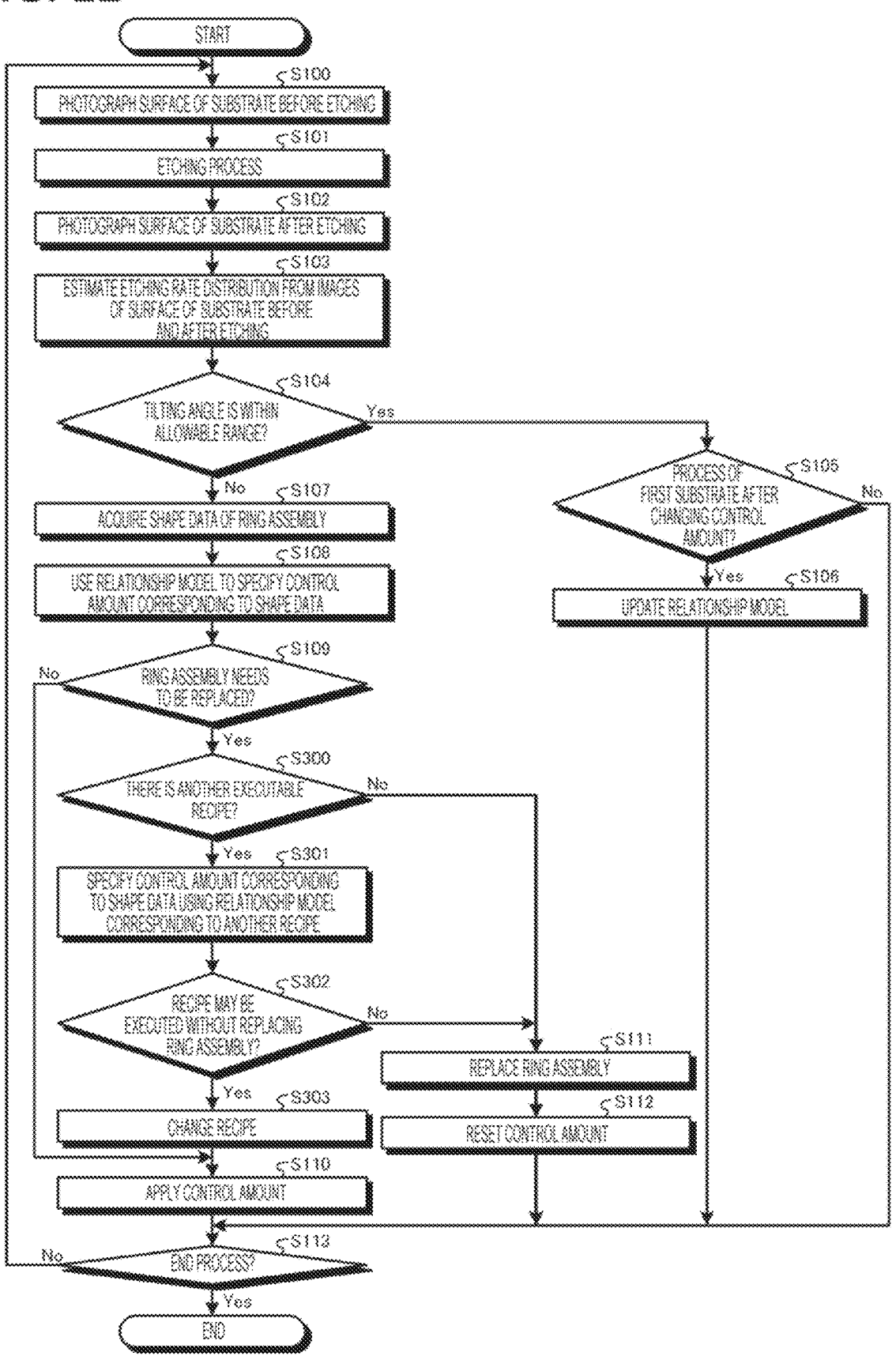
FIG. 12 is a flowchart illustrating an example of an etching control method according to a third embodiment.

FIG. 12 is a flowchart illustrating an example of an etching control method according to a third embodiment. Except for the points described below, the processes in FIG. 12 denoted by the same reference numerals as those in FIG. 9 are the same as the processes described in FIG. 9, and thus, descriptions thereof are omitted.

When it is determined in step S109 that the ring assembly 322 needs to be replaced, the control device 20 refers to the storage unit 20a2 to determine whether there is another executable recipe in addition to the recipe currently being executed (S300). When it is determined that there is no other executable recipe (S300: "No"), the ring assembly 322 is replaced (S111).

Meanwhile, when it is determined that there is no other executable recipe (S300: "Yes"), the control device 20 specifies the control amount corresponding to the shape data using the relationship model corresponding to another recipe (S301). Then, the control device 20 determines whether the control amount specified by the relationship model is within the changeable control amount range, thereby determining whether the recipe may be executed without replacing the ring assembly 322 (S302).

When it is determined that the specified control amount is within the changeable control amount range, that is, when the recipe may be executed without replacing the ring assembly 322 (S302: "Yes"), the control device 20 changes the recipe being executed to another recipe (S303). Then, the process illustrated in step S110 is executed. The processes of steps S300 to S303 and the process of step S101 after step S303 is performed are examples of step (f).

When the specified control amount is outside the changeable control amount range, that is, when the ring assembly 322 needs to be replaced to execute the recipe (S302: "No"), the process illustrated in step S111 is executed.

The third embodiment has been described above. As described above, an etching control method according to an embodiment of the present disclosure further includes step (f). In step (f), when the control amount specified in step (b) exceeds the predetermined control amount range, among the relationship models corresponding to other recipes, when there is another relationship model that may specify the control amount in which the tilting angle of the recess may be maintained within the allowable range with the control amount within the range of the predetermined control amount, the control amount specified by other relationship models is applied without replacing the ring assembly 322 and other recipes corresponding to other relationship models are executed. As a result, the frequency of replacement of the ring assembly 322 may be reduced, and the running cost of the process may be reduced.

[Others]

The technology disclosed in the present application is not limited to the above-described embodiments, and various modifications are possible within the scope of the gist thereof.

For example, in each of the above-described embodiments, in step S104, after it is determined from the etching rate distribution that the tilting angle of the recess formed in the substrate W is outside the allowable range, the shape data of the ring assembly 322 is collected in step S107. However, the disclosed technology is not limited thereto. Alternatively, in step S101, when the substrate W is placed on the substrate support portion 32 and/or when the substrate W is removed from the substrate support portion 32, the distance sensor 111a may collect the shape data of the ring assembly 322. Thus, when it is determined in step S104 that the tilting angle of the recess is outside the allowable range, the already collected shape data is used to specify the control amount applied to the ring assembly 322. Therefore, the process of collecting the shape data of the ring assembly 322 in step S107 becomes unnecessary, and a throughput of the process may be improved.

Further, in each of the above-described embodiments, the trajectory of the transfer arm 111 when collecting the shape data of the ring assembly 322 is the same as the trajectory of the transfer arm 111 when loading the substrate W into the processing module 30 or unloading the substrate W from the processing module 30. However, the disclosed technology is not limited thereto. Alternatively, the transfer arm 111 may be moved in a trajectory such that shape data is collected by the distance sensor 111a at a plurality of positions in the radial direction of the ring assembly 322 and a plurality of positions in the circumferential direction of the ring assembly 322. For example, the control device 20 moves the transfer arm 111 such that the distance sensor 111a traverses above the ring assembly 322 in the radial direction of the ring assembly 322 at different positions in the circumferential direction of the ring assembly 322. Thus, the degree of wear of the ring assembly 322 may be grasped more accurately.

Further, in each of the above-described embodiments, a multiple regression model has been described as an example of the relationship model, but the technology disclosed herein is not limited thereto, and the relationship model may be a model other than the multiple regression model. For example, the relationship model may be a machine learning model such as a neural network model.

Further, in each of the above-described embodiments, the magnitude of the DC voltage applied to the ring assembly 322 has been described as an example of the control amount for controlling the sheath near the edge of the substrate W. However, the disclosed technology is not limited thereto. Any control amount other than the magnitude of the DC voltage applied to the ring assembly 322 may be used as long as the control amount is capable of controlling the sheath near the edge of the substrate W. The control amounts by which the sheath near the edge of substrate W may be controlled include, for example, the magnitude of the RF power applied to the ring assembly 322 and the amount of lift of the ring assembly 322 when the ring assembly 322 is lifted upward.

Further, in each of the above-described embodiments, the shape data of the ring assembly 322 is collected using the distance sensor 111a provided on the lower surface of the transfer arm 111, but the disclosed technology is not limited thereto. Alternatively, the distance sensor 111*a* may be fixed to a member inside the plasma processing chamber 31. In this case, the distance sensor 111*a* may emit light toward, for example, a plurality of positions on the surface of the ring assembly 322, and collect shape data by measuring the distance to the ring assembly 322 based on a time difference between emitted light and reflected light.

In each of the above-described embodiments, the processing module 30 that performs process using capacitively coupled plasma (CCP) has been described as an example of a plasma source, but the plasma source is not limited thereto. Examples of plasma sources other than the capacitively coupled plasma include inductively coupled plasma (ICP), microwave excited surface wave plasma (SWP), electron cyclotron resonance plasma (ECP), and helicon wave excited plasma (HWP).

According to the present disclosure, the running costs of the process may be reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching control method comprising:
(a) collecting shape data including height information of a ring assembly measured at a plurality of locations on a surface of the ring assembly, the ring assembly being disposed to surround an area on a stage on which a substrate is placed;
(b) specifying a control amount from the shape data collected in (a) by using a relationship model representing a relationship between pre-collected shape data that has been collected in advance and a control amount capable of controlling a sheath distribution near the ring assembly by which a tilting angle of a recess formed in the substrate by plasma etching is within an allowable range; and
(c) applying the control amount specified in (b) thereby controlling the sheath distribution near the ring assembly,
wherein in (a), a distance between a distance sensor and the ring assembly is measured at the plurality of locations on the surface of the ring assembly using the distance sensor provided on a transfer arm that transfers the substrate.

2. The etching control method according to claim 1, wherein the distance measured at each of the plurality of locations is included in the shape data as the height information of the ring assembly at each location.

3. The etching control method according to claim 2, wherein (a) is performed while the transfer arm passes near the ring assembly when the transfer arm places the substrate on the stage or when the transfer arm removes the substrate from the stage.

4. The etching control method according to claim 1, wherein in (a), the shape data is collected at a plurality of locations in a radial direction of the ring assembly and at a plurality of locations in a circumferential direction of the ring assembly.

5. The etching control method according to claim 1, further comprising:

(d) estimating an etching rate distribution based on a difference between a film thickness distribution of the substrate before the plasma etching is performed and a film thickness distribution of the substrate after the plasma etching is performed, and determining whether the tilting angle of the recess is within the allowable range, from the etching rate distribution,
wherein (a) to (c) are performed when determined that the tilting angle exceeds the allowable range in (d).

6. The etching control method according to claim 5, further comprising:
(e) after the shape data is collected in (a), the control amount is specified in (b), the sheath distribution near the ring assembly is controlled in (c), and then the tilting angle is determined to be within the allowable range in (d), updating the relationship model using the shape data and the control amount.

7. The etching control method according to claim 1, wherein the relationship model is prepared in advance for each recipe, and
in (b), when a recipe is changed to another recipe, the control amount is specified from the shape data collected in (a) using the relationship model corresponding to the another recipe.

8. The etching control method according to claim 7, further comprising:
(f) when the control amount specified in (b) exceeds a range of a predetermined control amount, and when, among the relationship models corresponding to other recipes, there is another relationship model that specifies the control amount capable of maintaining the tilting angle of the recess within the allowable range with the range of the predetermined control amount, applying the control amount specified by the another relationship model and executing a recipe corresponding to the another relationship model without replacing the ring assembly.

9. The etching control method according to claim 1, wherein the relationship model is a multiple regression model or a neural network model.

10. The etching control method according to claim 1, further comprising:
(g) cleaning the ring assembly before (a) is performed.

11. The etching control method according to claim 1, wherein the ring assembly includes an edge ring disposed around the surface of the stage on which the substrate is placed, and a cover ring disposed around the edge ring.

12. The etching control method according to claim 1, wherein the control amount is an amount of DC voltage applied to the ring assembly, a magnitude of radio-frequency (RF) power applied to the ring assembly, or an amount of increase when the ring assembly is raised by a driver.

13. The etching control method according to claim 1, further comprising:
(d) estimating an etching rate distribution based on a difference between a film thickness distribution of the substrate before the plasma etching is performed and a film thickness distribution of the substrate after the plasma etching is performed, and determining whether the tilting angle of the recess is within the allowable range, from the etching rate distribution.

14. The etching control method according to claim 1, wherein the relationship model is prepared in advance for each recipe.

15. The etching control method according to claim 1, wherein the relationship model is a multiple regression model.

16. The etching control method according to claim 1, wherein the relationship model is a neural network model.

17. An etching control system comprising:

a plasma etching apparatus configured to etch a substrate using plasma;

a transfer device configured to transfer the substrate to the plasma etching apparatus; and a controller, wherein the plasma etching apparatus incudes:

a chamber;

a stage provided in the chamber and configured to place the substrate thereon;

a ring assembly disposed to surround an area on the stage on which the substrate is placed; and a sheath controller configured to control a sheath distribution near the ring assembly, wherein the transfer device includes:

a transfer arm configured to transfer the substrate; and a distance sensor provided on the transfer arm, and wherein the controller is configured to execute a process including:

(a) controlling the transfer arm and the distance sensor to collect shape data including height information of the ring assembly measured at a plurality of locations on the surface of the ring assembly;

(b) specifying a control amount from the shape data collected in (a) by using a relationship model representing a relationship between pre-collected shape data that has been collected in advance and a control amount of the sheath controller by which a tilting angle of a recess formed in the substrate by plasma etching is within an allowable range; and (c) applying the control amount specified in (b) to the sheath controller, thereby controlling the sheath distribution near the ring assembly.

* * * * *